(12) United States Patent
Schulz et al.

(10) Patent No.: US 10,879,136 B2
(45) Date of Patent: Dec. 29, 2020

(54) METHOD FOR PRODUCING AN OPTOELECTRONIC DEVICE

(71) Applicant: OSRAM OLED GmbH, Regensburg (DE)

(72) Inventors: Robert Schulz, Schierling (DE); Christian Leirer, Friedberg (DE); Korbinian Perzlmaier, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/761,048

(22) PCT Filed: Sep. 15, 2016

(86) PCT No.: PCT/EP2016/071855
§ 371 (c)(1),
(2) Date: Mar. 16, 2018

(87) PCT Pub. No.: WO2017/046261
PCT Pub. Date: Mar. 23, 2017

(65) Prior Publication Data
US 2018/0269117 A1    Sep. 20, 2018

(30) Foreign Application Priority Data

Sep. 17, 2015   (DE) .................. 10 2015 115 706

(51) Int. Cl.
*H01L 33/62* (2010.01)
*H01L 33/08* (2010.01)
(Continued)

(52) U.S. Cl.
CPC .......... *H01L 22/24* (2013.01); *G01R 31/2635* (2013.01); *H01L 23/645* (2013.01);
(Continued)

(58) Field of Classification Search
CPC ..... H01L 22/24; H01L 33/502; H01L 23/645; H01L 33/647; H01L 33/62; H01L 33/08;
(Continued)

(56) References Cited

U.S. PATENT DOCUMENTS 5,866,984 A * 2/1999 Doughty ................. H01J 61/16
313/485
6,117,643 A * 9/2000 Simpson .................. C12Q 1/02
435/7.1
(Continued)

FOREIGN PATENT DOCUMENTS

DE   102013102322 A1   9/2014
DE   102015114010 A1   3/2017
(Continued)

*Primary Examiner* — Edward Chin
(74) *Attorney, Agent, or Firm* — Slater Matsil, LLP

(57) ABSTRACT

A method for producing an optoelectronic device is disclosed. The method include preforming an inductive excitation of a current by an inductive component of the optoelectronic device such that the optoelectronic device emits electromagnetic radiation, measuring of at least one electro-optical characteristic of the optoelectronic device and applying a converter material to an emission side of the optoelectronic device, wherein a quantity of the converter material is determined from the measurement of the electro-optical characteristic.

16 Claims, 3 Drawing Sheets

(51) Int. Cl.
  *H01L 23/64* (2006.01)
  *H01L 21/66* (2006.01)
  *H01L 33/64* (2010.01)
  *G01R 31/26* (2020.01)
  *H01L 33/50* (2010.01)

(52) U.S. Cl.
  CPC ............ *H01L 33/08* (2013.01); *H01L 33/502* (2013.01); *H01L 33/62* (2013.01); *H01L 33/647* (2013.01); *H01L 2933/0016* (2013.01); *H01L 2933/0041* (2013.01); *H01L 2933/0066* (2013.01)

(58) Field of Classification Search
  CPC ..... H01L 2933/0041; H01L 2933/0066; H01L 2933/0016; G01R 31/2635; F21V 25/04; F21V 9/30; F21V 25/02; C09K 11/7774; H05B 33/145; F21S 41/16; F21S 41/14
  See application file for complete search history.

(56) References Cited

U.S. PATENT DOCUMENTS

| | | | | |
|---|---|---|---|---|
| 6,274,986 | B1* | 8/2001 | Devonshire | H01J 61/822 315/237 |
| 9,693,714 | B2 | 7/2017 | DeHennis et al. | |
| 2002/0139387 | A1* | 10/2002 | Yates | C23G 1/02 134/1 |
| 2002/0139987 | A1* | 10/2002 | Collins, III | H01L 27/156 257/88 |
| 2009/0152664 | A1* | 6/2009 | Klem | H01L 27/14641 257/440 |
| 2009/0159677 | A1* | 6/2009 | Yakimov | H05B 45/60 235/439 |
| 2010/0090935 | A1* | 4/2010 | Tseng | C09K 11/7774 345/83 |
| 2010/0123386 | A1* | 5/2010 | Chen | H01L 33/504 313/502 |
| 2011/0217794 | A1* | 9/2011 | Tetz | H01L 33/005 438/16 |
| 2011/0309236 | A1* | 12/2011 | Tian | H01L 27/14687 250/208.1 |
| 2012/0261703 | A1* | 10/2012 | Zimmerman | H01L 33/641 257/98 |
| 2013/0211213 | A1 | 8/2013 | DeHennis et al. | |
| 2014/0362885 | A1* | 12/2014 | Sakuta | H01L 33/50 372/44.01 |
| 2016/0003890 | A1* | 1/2016 | Schulz | G01R 31/2635 315/149 |
| 2016/0033112 | A1* | 2/2016 | Weissenberger | F21V 9/30 362/510 |
| 2017/0089546 | A1* | 3/2017 | Verschuuren | F21V 9/30 |
| 2018/0024185 | A1 | 1/2018 | Schulz et al. | |
| 2018/0306425 | A1* | 10/2018 | Massmann | C09K 11/7774 |
| 2018/0357455 | A1* | 12/2018 | Roach | H01L 25/0753 |

FOREIGN PATENT DOCUMENTS

| | | | |
|---|---|---|---|
| JP | 2003188416 A | | 7/2003 |
| JP | 2005158650 A | * | 6/2005 |
| JP | 2005158650 A | | 6/2005 |
| JP | 2005327845 A | | 11/2005 |
| JP | 2006135367 A | | 5/2006 |
| KR | 20140059984 A1 | | 5/2014 |
| TW | 201339567 A | | 10/2013 |
| WO | 2014135644 A1 | | 9/2014 |
| WO | 2016124367 A1 | | 8/2016 |

* cited by examiner

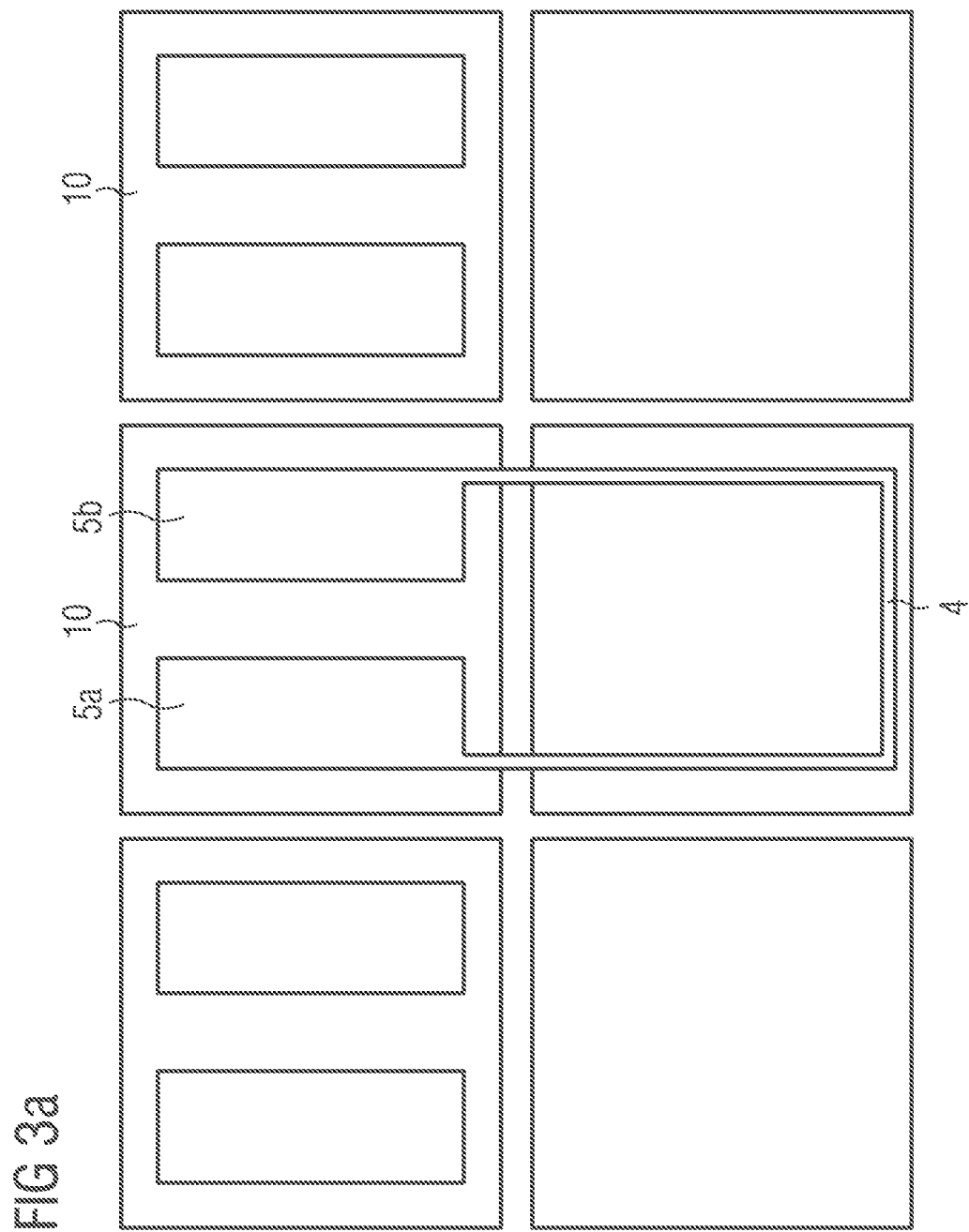

METHOD FOR PRODUCING AN OPTOELECTRONIC DEVICE

This patent application is a national phase filing under section 371 of PCT/EP2016/071855, filed Sep. 15, 2016, which claims the priority of German patent application 10 2015 115 706.3, filed Sep. 17, 2015, each of which is incorporated herein by reference in its entirety.

TECHNICAL FIELD

The invention relates to a method for producing an optoelectronic device.

SUMMARY OF THE INVENTION

Embodiments of the invention provide a method for producing an optoelectronic device with inductive incoupling of an operating voltage into the device.

The method for producing an optoelectronic device may comprise inductive performing an excitation of a current by an inductive component of the optoelectronic device, such that the optoelectronic device is excited to emit electromagnetic radiation. Furthermore, the method comprises measuring of at least one electro-optical characteristic of the optoelectronic device, and application of a converter material to an emission side of the optoelectronic device, wherein the quantity of converter material to be applied is determined from the measurement of the electro-optical characteristic.

The emission characteristics of the optoelectronic device may advantageously be adapted to preset values by means of the method during production of the optoelectronic device. It is advantageously possible that in this case the optoelectronic device does not need to be externally contacted via contacts, for example, electrodes, which are passed out of the device in order to allow test operation. Incoupling of an operating voltage via an inductive component advantageously allows contacting of the device, such that the inductive component acting as contact point may advantageously remain encapsulated in the device and be protected from external influences. In other words, test operation of the optoelectronic device is possible without direct contact with an external circuit. In this way, current losses or interruptions associated with contacting of a direct contact may be avoided or at least reduced. Inductive incoupling is suitable, for example, for components in which conversion materials cover at least one contact of the device or which are situated in the wafer assembly during production. With such optoelectronic devices, inductive contacting for test operation is advantageous with regard to continuation of production.

For inductive excitation, a magnetic field variable over time may advantageously be applied to the optoelectronic device.

The optoelectronic device may advantageously comprise a light-emitting semiconductor body, for example, an LED chip.

According to at least one embodiment of the method, converter material is also applied to the emission side of the optoelectronic device prior to inductive excitation of the current by the inductive component. In this way, converter material is already located on the emission side before the electro-optical characteristic is measured. After measurement of the electro-optical characteristic, the electro-optical characteristic is compared with a setpoint value and a further quantity of the converter material determined thereby is applied.

An iterative procedure advantageously enables application of the converter material until a setpoint value of the electro-optical characteristic is almost reached. A quantity of the converter material is advantageously always applied which is slightly smaller than is necessary to achieve the specified setpoint value of the electro-optical characteristic. The converter material may be applied in a layer or in multiple layers. In a further step, the modified electro-optical characteristic is measured again in test operation and the difference quantity of converter material is determined which is lacking in relation to achieving the setpoint value of the electro-optical characteristic. In a further step, a slightly smaller quantity is applied than the difference quantity of converter material. The converter material is, for example, a silicone converter mixture. This procedure is repeated until the electro-optical characteristic of the optoelectronic device is achieved within acceptable limits. Applying a greater quantity of the converter material than is needed to achieve the electro-optical characteristic is advantageously avoided, since it is advantageously intended to avoid subsequent removal of excess converter material. The number of iterative repetitions of application is a direct measure of the accuracy of the method and the resultant manufacturing tolerances.

The converter material may, for example, comprise quantum dots, quantum wires, multiphosphors or the like and also multiple converter materials may be applied simultaneously. It is furthermore also possible for scattering materials such as for instance $TiO_2$ or $SiO_2$ and matrix materials such as silicone, Ormocer, epoxide or glass to be applied with the converter material.

According to at least one embodiment of the method, the electro-optical characteristic is a color location of the emitted radiation and the quantity of converter material to be applied is selected such that the color location of the emitted radiation of the device, within the limits of manufacturing tolerances, has a fixed setpoint value.

Since, for application of the converter material, a slightly smaller quantity is always applied than is needed to achieve the color location, even with a high number of iterative application repetitions the setpoint value of the color location is not achieved exactly. With a high number of iterative steps, however, it is advantageously possible to keep manufacturing tolerances low. A specified color location, for example, in a CIE diagram, may advantageously be achieved during production of the device by inductively excited test operation of the device.

According to at least one embodiment of the method, the optoelectronic device comprises a light-emitting semiconductor body, which comprises a first segment and a second segment, wherein the first segment and the second segment comprise an emission side, wherein the first segment and the second segment are electrically interconnected and an alternating voltage is coupled into the optoelectronic device via the inductive component by generation of an electromagnetic alternating field variable over time.

According to at least one embodiment of the method, the first segment and the second segment are interconnected in antiparallel with one another and the inductive component is interconnected in parallel with the first segment and with the second segment.

The light-emitting semiconductor body with the first segment and the second segment may advantageously be shaped such that the first segment and the second segment are separated from one another spatially and each have an emission side which is remote from a carrier of the semiconductor body. The carrier may advantageously be a molding which on one side covers and partly embeds the semiconductor body. The molding may be a potting material. Furthermore, the optoelectronic device advantageously comprises an electrical conductor track, which is arranged on the first segment and on the second segment on a side of the light-emitting semiconductor body facing the carrier of the semiconductor body, and a first electrical interconnect structure and a second electrical interconnect structure, which respectively connect together electrically the first segment and the second segment and which are connected together electrically by means of the electrical conductor track, such that the first segment and the second segment are advantageously interconnected in antiparallel by the first electrical interconnect structure and the second electrical interconnect structure. The first electrical interconnect structure, the second electrical interconnect structure and the electrical conductor track are, for example, completely covered by the molding on a side of the light-emitting semiconductor body facing the carrier. The electrical conductor track advantageously constitutes the inductive component.

The first segment may advantageously be separated from the second segment by means of a separating trench, which has been introduced into the semiconductor body. The semiconductor body may comprise a semiconductor region with an active zone. The separating trench may, for example, extend right through the semiconductor region and into the carrier. Furthermore, the first segment and the second segment are configured such that the emission sides thereof point in the same direction. The converter material is advantageously applied during the production process to the emission sides of the first segment and the second segment.

The first electrical interconnect structure and the second electrical interconnect structure are arranged in such a way on the semiconductor body that the first segment is electrically connected with the second segment. This is advantageously achieved in that the interconnect structures bridge the separating trench on a side facing the carrier and are arranged partly on the first and partly on the second segment. The interconnect structures here electrically contact the semiconductor regions of the semiconductor body. The first interconnect structure thus connects the first segment electrically with the second segment and the second interconnect structure thus connects the second segment electrically with the first segment. In this way, a closed circuit is advantageously produced by the segments and the interconnect structures, wherein the segments are interconnected in antiparallel with one another. For example, an n-type semiconductor region of the first segment is connected by the first interconnect structure with a p-type semiconductor region of the second segment, and a p-type semiconductor region of the first segment is connected by the second interconnect structure with an n-type semiconductor region of the second segment. Alternatively, reversed n- and p-type connection is respectively also possible.

The inductive component advantageously serves in inductive current incoupling by means of an external magnetic field, wherein the inductive component generates an electrical potential between the first interconnect structure and the second interconnect structure which, due to the inductively incoupled magnetic field variable over time, is itself variable over time.

To bring about light emission at the semiconductor body, when an alternating current is incoupled via the inductive component, the first segment and the second segment are advantageously connected in antiparallel. In other words, depending on the direction of the induced current one segment acts as a diode in the conducting direction and the other segment as a diode in the non-conducting direction. In the event of phase inversion of the voltage, the circuit acts in reverse. In this way, the optoelectronic device may advantageously be operated with an inductively incoupled alternating current.

The interconnect structures and the conductor track are covered over by the molding and not exposed, since advantageously no external contacting is necessary.

For inductive excitation, a further inductive element, for example, an excitation coil, is applied advantageously close to the component and advantageously induces an alternating voltage in the optoelectronic device via an electromagnetic alternating field, for example, by an alternating current through the excitation coil.

The optoelectronic device may comprise just the electrical conductor track for internal voltage generation and be operated inductively in the finished form or have externally accessible electrodes via which the optoelectronic device is operated once finished. The inductive component may be present in the optoelectronic device in addition to the electrical conductor track, or the electrical conductor track may itself embody the inductive component for test operation.

According to at least one embodiment of the method, the inductive component comprises a coil with at least one turn.

The inductive component is advantageously embodied in the optoelectronic device in such a way that a magnetic flux of an externally applied magnetic field is enclosed at least in part within an area by the inductive component. This is advantageously ensured by the shape of the inductive component as a coil with one or more turns. Advantageously, the external magnetic field is at least the size of the area enclosed by the inductive component. This may advantageously be achieved by an excitation coil which has a cross-sectional area for the magnetic flux which is at least the size of the area enclosed by the inductive component.

According to at least one embodiment of the method, the inductive component is covered with an encapsulation. The inductive component may in this way be constructed completely within the optoelectronic device.

The inductive component for test operation is advantageously arranged in a region of the optoelectronic device in which the optoelectronic device may be fixed and separated from the surroundings of the device after mounting of the inductive component in the device. This is advantageously achieved by means of an encapsulation, for example, with the inductive component being covered by a molding or potting compound. In optoelectronic devices which have to be encapsulated relative to the surroundings in order to suppress harmful environmental influences, direct electrical contacting for test operation proves difficult and inductive incoupling of a voltage advantageous.

According to at least one embodiment of the method, the optoelectronic device is produced in a wafer assembly with a multiplicity of optoelectronic devices.

Multiple optoelectronic devices may advantageously be produced in an assembly, wherein the emission sides of the devices may be covered with a converter material during production. Advantageously, an inductive component is connected to the optoelectronic device while it is in the wafer assembly or while it is being produced in the wafer assembly. Inductive contacting may advantageously couple a voltage into the device without additional conductor tracks having to be guided to the respective device at wafer level.

According to at least one embodiment of the method, the wafer assembly is singulated into a multiplicity of optoelectronic devices.

Singulation of the wafer assembly into individual optoelectronic devices may proceed, for example, by means of etching methods, sawing or laser cutting.

According to at least one embodiment of the method, the inductive component extends over a single optoelectronic device and remains intact after singulation of the wafer assembly.

According to at least one embodiment of the method, the inductive component respectively extends beyond the optoelectronic device and is severed on singulation of the wafer assembly.

According to at least one embodiment of the method, the inductive component is interconnected electrically with multiple optoelectronic devices and a current is excited in multiple optoelectronic devices.

The inductive component may advantageously lie within the region to be singulated of the optoelectronic device or extend therebeyond. In other words, precisely one optoelectronic device is assigned to precisely one inductive component, advantageously as a coil. In the event of the inductive component being located solely within the region to be singulated of the optoelectronic device, further inductive operation is possible after singulation, since the inductive component is advantageously not destroyed by the singulation. In the event of the inductive component, advantageously because of the manner of production thereof, extending beyond an optoelectronic device, it is advantageously possible for the inductive component to extend over two or more optoelectronic devices or sub-regions of the wafer. Application of the inductive component extending over more than one optoelectronic device is only possible in the wafer assembly of the devices, provided the production process has not been completed.

It is moreover feasible to connect an inductive component which is located within an optoelectronic device or extends over multiple optoelectronic devices with multiple optoelectronic devices and to bring about simultaneous test operation.

According to at least one embodiment of the method, the electro-optical characteristic is a brightness or a spectrum of the radiation emitted by the optoelectronic device.

Further spectral characteristics may advantageously likewise serve as the electro-optical characteristic to be measured. Depending on the respective electro-optical characteristic, a scattering material, a filter material or the like may advantageously be applied with the converter material in iterative method steps.

BRIEF DESCRIPTION OF THE DRAWINGS

An optoelectronic device described here and a method for producing and operating an optoelectronic device are explained in greater detail below with reference to exemplary embodiments and the associated figures.

FIG. 1 and FIGS. 3a to 3b show an optoelectronic device in plan view onto an inductive component of the device.

Identical or identically acting elements are provided with identical reference numerals in the figures. The components illustrated in the figures and the size ratios of the components to one another should not be regarded as to scale.

DETAILED DESCRIPTION OF ILLUSTRATIVE EMBODIMENTS

Figure 1:
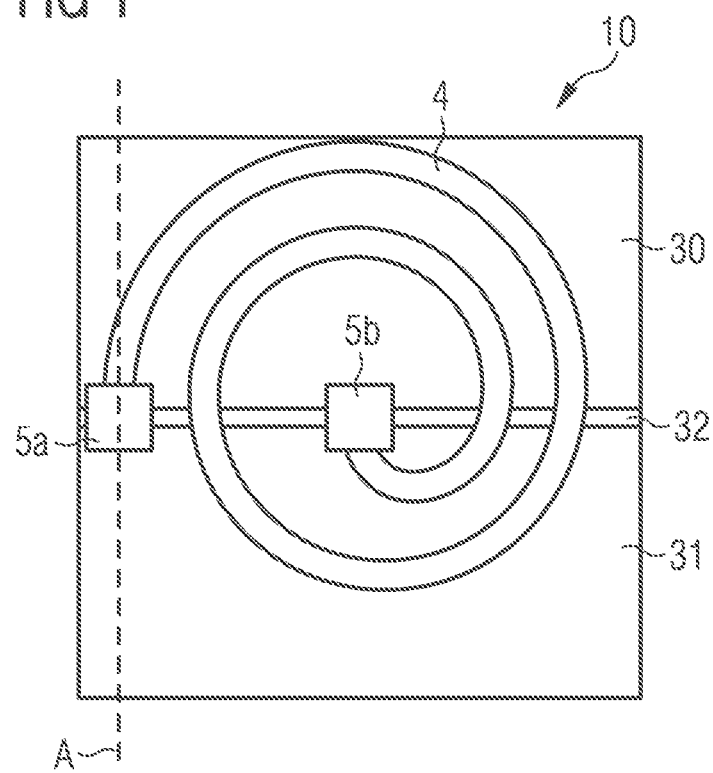

FIG. 1 shows in plan view onto the optoelectronic device 10 a semiconductor body with a first segment 30 and a second segment 31, the plan view being onto a side which faces a carrier or an encapsulation and advantageously is remote from the emission side. The first segment 30 and the second segment 31 are separated from one another by a separating trench 32. A first electrical interconnect structure 5a and a second electrical interconnect structure 5b are arranged in such a way on the semiconductor body that they each span the separating trench 32 and in each case are arranged partly on the first segment 30 and partly on the second segment 31. This makes it possible, for example, for the first interconnect structure 5a to connect a p-type semiconductor region of the first segment with an n-type semiconductor region of the second segment, and for the second interconnect structure 5b to connect an n-type semiconductor region of the first segment to a p-type semiconductor region of the second segment, the segments thereby being interconnected in antiparallel. Furthermore, FIG. 1 shows an electrical conductor track as an inductive component 4, which is arranged on the first segment 30 and on the second segment 31, spans the separating trench 32 and connects the first interconnect structure 5a to the second interconnect structure 5b. The inductive component 4 is advantageously planar in form. The inductive component 4 comprises at least one turn and acts as a coil for inductive incoupling of alternating current into the device 10. In this case, the inductive component 4 is connected in parallel with the first segment 30 and the second segment 31.

It is alternatively also possible to configure the semiconductor body with just one segment without a separating trench.

Figure 2:
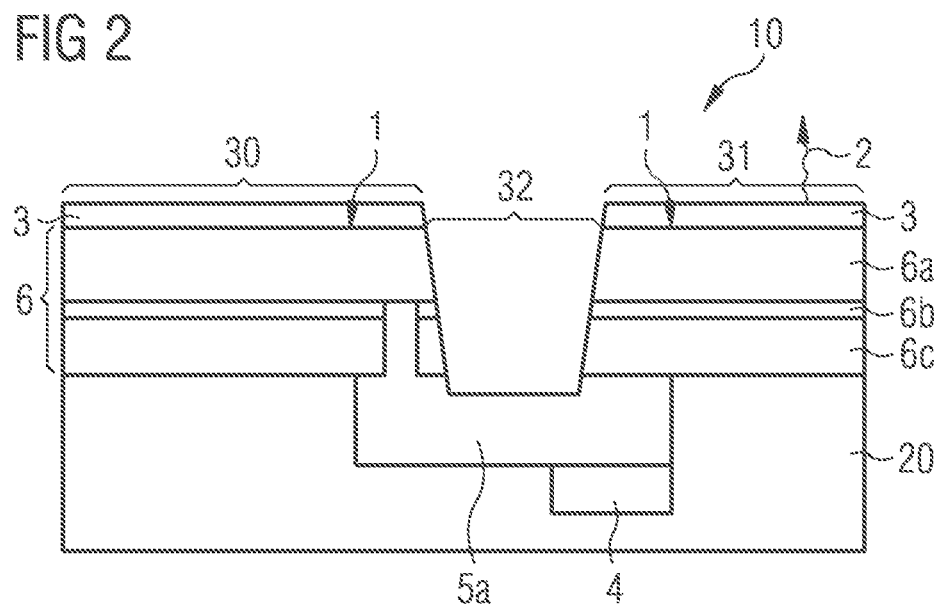
FIG. 2 is a schematic side view of the optoelectronic device during production.

FIG. 2 shows the optoelectronic device 10 during production. In test operation, a current is coupled into the device 10 via the inductive component 4, the current being an alternating current. The device 10 is configured according to FIG. 1 with two segments 30 and 31, which are interconnected with one another in antiparallel. FIG. 2 shows a cross-section through the optoelectronic device 10 along a line A of FIG. 1. The first segment 30 and the second segment 31 each comprise a semiconductor region 6 which has an n-type semiconductor region 6a, a p-type semiconductor region 6c and an active zone 6b. The first electrical interconnect structure 5a connects the n-type semiconductor region 6a of the first segment 30 with the p-type semiconductor region 6c of the second segment. This is achieved by the first electrical interconnect structure 5a advantageously penetrating through the active zone 6b and the p-type semiconductor region 6c situated under the n-type semiconductor region 6a in the first segment 30 by means of a through-via insulated at the edges. Alternatively, contact guidance on the outside of the segment 30 to the n-type semiconductor region 6a is possible without a through-via. The inner sides of the separating trench 32 advantageously comprise electrical insulation. Contacting of the semiconductor regions 6a and 6c of the segments 30 and 31 by the first electrical interconnect structure 5a could also be reversed. The arrangement of the n-type and p-type semiconductor regions is reversible.

Furthermore, the first electrical interconnect structure 5a is contacted, for example, at the bottom, remote from the semiconductor body, with an inductive component 4. A molding forms a carrier 20 in the form of a potting compound, in which the first electrical interconnect structure 5a and the inductive component 4 are embedded and covered by the molding.

The segments 30 and 31 each comprise an emission side 1 which is remote from the carrier 20. The semiconductor body emits radiation 2 via the emission side 1 alternately with the respective phase of the alternating voltage via the segments 30 and 31.

It is advantageously possible that the optoelectronic device 10 does not need to be externally contacted via contacts, for example, electrodes, which are passed out of the device in order to operate test operation. Incoupling of an operating voltage via an inductive component 4 advantageously allows contacting of the device 10, such that the inductive component 4 acting as contact point may advantageously remain encapsulated in the device 10 and be protected from external influences.

An iterative procedure advantageously allows application of a converter material 3 to the emission side 1 until a setpoint value of the electro-optical characteristic is almost reached. A quantity of the converter material 3 is advantageously always applied which is slightly smaller than is necessary to achieve the specified setpoint value of the electro-optical characteristic. The converter material may be applied in a layer or in multiple layers. In a further step, the modified electro-optical characteristic is measured again in test operation and the difference quantity of converter material 3 is determined which is lacking in relation to achieving the setpoint value of the electro-optical characteristic.

The converter material may, for example, comprise quantum dots, quantum wires, multiphosphors or the like and also multiple converter materials may be applied simultaneously. It is furthermore also possible for scattering materials such as for instance $TiO_2$ or $SiO_2$ and matrix materials such as silicone, Ormocer, epoxide or glass to be applied with the converter material 3.

FIG. 3a is a schematic plan view onto an arrangement of optoelectronic devices 10 in a wafer assembly with the interconnect structures 5a and 5b, wherein an inductive component 4 extends beyond one individual optoelectronic device 10. After singulation of the wafer, the inductive component 4 is split. Alternatively, it is also possible for the inductive component advantageously to extend only within the region to be singulated of the optoelectronic device. In other words, precisely one optoelectronic device may be associated with precisely one inductive component, which is not split on singulation of the wafer and may continue to be operated in the singulated device. In this case, it is advantageously possible for the optoelectronic device not to be segmented as in FIG. 1.

Figure 3B:
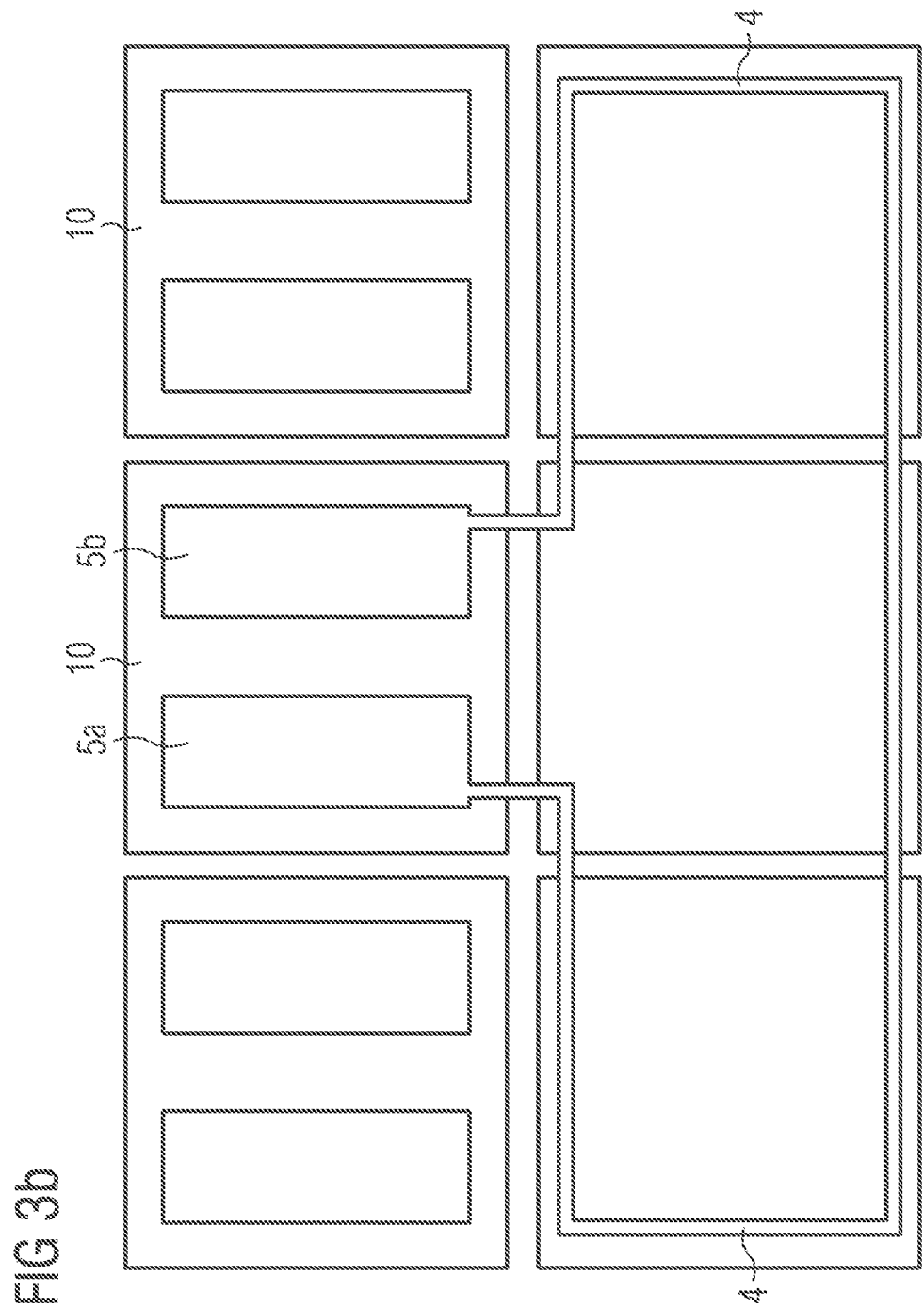

FIG. 3b shows an arrangement in which the inductive component 4 extends over multiple sub-regions of the wafer. In this case, it is possible to use for inductive current incoupling external excitation coils with a greater circumference and a greater area enclosed by the magnetic field. Furthermore, further optoelectronic devices are contained in the wafer assembly which are not inductively excited and therefore do not comprise any inductive component 4.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing an optoelectronic device, the method comprising:
   performing an inductive excitation of a current by an inductive component of the optoelectronic device such that the optoelectronic device emits electromagnetic radiation, wherein the optoelectronic device comprises a light-emitting semiconductor body comprising a first segment and a second segment, wherein the first segment and the second segment each comprise a semiconductor region which has an n-type semiconductor region, a p-type semiconductor region and an active zone, and wherein the first segment and the second segment comprise an emission side, and wherein the first segment and the second segment are electrically interconnected;
   measuring at least one electro-optical characteristic of the optoelectronic device; and
   applying a converter material to an emission side of the optoelectronic device, wherein a quantity of the converter material is determined based on the measurement of the electro-optical characteristic,
   wherein an alternating voltage is coupled to the optoelectronic device via the inductive component by generating an electromagnetic alternating field variable over time;
   wherein the optoelectronic device is produced in a wafer assembly comprising a plurality of optoelectronic devices; and
   wherein the inductive component respectively extends beyond the optoelectronic device and is severed during singulation of the wafer assembly such that after singulation, the inductive component is split.

2. The method according to claim 1, further comprising applying the converter material to the emission side of the optoelectronic device prior to performing the inductive excitation of the current by the inductive component.

3. The method according to claim 1, wherein the electro-optical characteristic is a color location of the emitted radiation, wherein the quantity of the converter material to be applied is selected such that the color location of the emitted radiation of the optoelectronic device has a substantially fixed setpoint value.

4. The method according to claim 1, wherein the first segment and the second segment are interconnected in antiparallel with one another and the inductive component is interconnected in parallel with the first segment and with the second segment.

5. The method according to claim 1, wherein the inductive component comprises a coil with at least one turn.

6. The method according to claim 1, wherein the inductive component is covered with an encapsulation.

7. The method according to claim 1, wherein the optoelectronic device is produced in a wafer assembly comprising a plurality of optoelectronic devices.

8. The method according to claim 7, wherein the wafer assembly is singulated into the plurality of optoelectronic devices.

9. The method according to claim 7, wherein the inductive component extends over a single optoelectronic device and remains intact after singulation of the wafer assembly.

10. The method according to claim 7, wherein the inductive component respectively extends beyond the optoelectronic device and is severed during singulation of the wafer assembly.

11. The method according to claim 10, wherein the inductive component is electrically interconnected with multiple optoelectronic devices and a current is excited in the multiple optoelectronic devices.

12. The method according to claim 1, wherein the electro-optical characteristic is a brightness of the radiation emitted by the optoelectronic device.

13. The method according to claim 1, wherein the electro-optical characteristic is a spectrum of the radiation emitted by the optoelectronic device.

14. The method according to claim 1, wherein the optoelectronic device comprises a potting compound or an encapsulation, in which the inductive component is embedded.

15. A method for producing an optoelectronic device, the method comprising:
    performing an inductive excitation of a current by an inductive component of the optoelectronic device such that the optoelectronic device emits electromagnetic radiation, wherein the optoelectronic device comprises segments, wherein the segments each comprise an emission side which is remote from a carrier and uncovered by the carrier;
    measuring at least one electro-optical characteristic of the optoelectronic device; and
    applying a converter material to an emission side of the optoelectronic device,
    wherein a quantity of converter material is determined from the measurement of the electro-optical characteristic,
    wherein the inductive component comprises a coil with at least one turn,
    wherein the optoelectronic device comprises a potting compound or an encapsulation, in which the inductive component is embedded, and
    wherein the potting compound or encapsulation is the carrier.

16. The method according to claim 1, wherein the first segment is separated from the second segment by a separating trench, which has been introduced into the semiconductor body.

* * * * *